United States Patent [19]

Ralston et al.

[11] Patent Number: 4,731,338
[45] Date of Patent: Mar. 15, 1988

[54] METHOD FOR SELECTIVE INTERMIXING OF LAYERED STRUCTURES COMPOSED OF THIN SOLID FILMS

[75] Inventors: John D. Ralston, Ithaca, N.Y.; Anthony L. Moretti, Lisle; Ravinder K. Jain, Warrenville, both of Ill.

[73] Assignee: Amoco Corporation, Chicago, Ill.

[21] Appl. No.: 916,818

[22] Filed: Oct. 9, 1986

[51] Int. Cl.$^4$ .................. H01L 21/265; H01L 21/203
[52] U.S. Cl. ................................. 437/22; 437/133; 437/936; 357/91; 372/45; 372/46
[58] Field of Search .............. 29/576 B, 569 L; 148/1.5, 187, 175; 372/45, 46

[56] References Cited

U.S. PATENT DOCUMENTS

| | | | |
|---|---|---|---|
| 4,318,752 | 3/1982 | Tien | 148/1.5 |
| 4,511,408 | 4/1985 | Holonyak, Jr. | 148/1.5 |
| 4,578,128 | 3/1986 | Gossard et al. | 148/175 |
| 4,585,491 | 4/1986 | Burnham et al. | 148/1.5 |
| 4,637,122 | 1/1987 | Carney et al. | 29/569 L |
| 4,639,275 | 1/1987 | Holonyak, Jr. | 148/1.5 |
| 4,654,090 | 3/1987 | Burnham et al. | 148/1.5 |

OTHER PUBLICATIONS

Knox et al Phys. Rev. Letts. 56 (1986) 1191.
Kirilov et al Appl. Phys. Letts. 48 (1986) 53.

*Primary Examiner*—Upendra Roy
*Attorney, Agent, or Firm*—Richard A. Kretchmer; William H. Magidson; Ralph C. Medhurst

[57] ABSTRACT

A multilayer structure formed of two or more separate layers of different materials can be selectively intermixed so as to become compositionally transmuted, such that the distinction between the different original materials is lost, at least partially. This intermixing is accomplished by employing irradiation with a pulsed or rapidly scanned laser or electron beam. In addition, the intermixing can be accomplished by multiple pulses from the laser or electron beam so as to increase the degree of intermixing, thereby obtaining a more complete mixing.

18 Claims, 10 Drawing Figures

METHOD FOR SELECTIVE INTERMIXING OF LAYERED STRUCTURES COMPOSED OF THIN SOLID FILMS

BACKGROUND OF THE INVENTION

This invention relates generally to synthetic layered structures composed of two or more thin solid films and more particularly, it relates to a method for selective intermixing of such layered structures by utilizing a laser or electron beam as the energy source.

By way of background, a particular class of synthetic layered structures of considerable importance is the semiconductor superlattice in which two semiconductor materials with different electronic properties are interleaved in thin layers either (1) by depositing sheets of two semiconducting materials in an alternating manner, or (2) by introducing impurities into layers of a single semiconducting material. The former is designated as a compositional or heterostructure superlattice, and the latter is designated as a doping superlattice. Thus, a compositional superlattice comprises a periodic array consisting of alternating layers of two different semiconductors. Each layer has a thickness in the range from a single atomic layer up to several hundred atomic layers. In a compositional superlattice, the two semiconductors are so chosen that their band gaps, i.e., the difference in energy between the materials' valence and conduction bands, are different.

In the literature, a structure composed of two thin films of different semiconductors is called a single heterostructure. A structure composed of a semiconductor film of lower band gap sandwiched between two semiconductor layers of larger band gap is referred to as a double heterostructure. When the middle layer is sufficiently thin, the structure is called a single quantum well (SQW). A periodic structure composed of alternating layers of two different semiconductors is sometimes also referred to as "multiple-quantum-wells" (MQW) depending on the thickness of the semiconductor layer with the larger band gap. For the purposes of this invention, the distinction between a superlattice and a MQW is not essential, and thus the term "superlattice" will be used henceforth for the sake of simplicity. As used herein, it is intended that the term "selective intermixing" includes also the case where all regions of a synthetic layered structure are intermixed as well as the case where only a limited portion thereof is intermixed.

Specifically, each layer of the semiconductor having the smaller band gap produces what is referred to as a potential well in either the conduction band or the valence band or in both. In terms of optical and electronic properties, important distinctions can be made between three different types of semiconductor superlattices, commonly referred to as types of I, I', and II depending on the relative alignment of the conduction and valence bands in the two semiconductors. However, for the purposes of this invention, such distinctions are not essential, and thus a further discussion thereof is not necessary. Inside each potential well, only certain energy states or levels are available to the confined carriers (electrons in the conduction-band or holes in the valence-band). The values of the energy levels available to the electrons can be selectively controlled by appropriate choice of semiconductor materials and the width of their layers. In this fashion, the electronic and/or optical properties of SQW's, or of compositional or doping superlattices can be tailored.

It is generally well known in the art that in a semiconductor multilayer structure, the semiconductor with the smaller band gap can be a material such as gallium arsenide (GaAs) and the one with the larger band gap can be a material such as aluminum gallium arsenide ($Al_x Ga_{1-x}As$) having a variable aluminum mole fraction x. Compositional superlattices and SQW's consisting of gallium arsenide and aluminum gallium arsenide are generally grown by metalorganic chemical vapor deposition (MO-CVD), molecular beam expitaxy (MBE), liquid phase epitaxy (LPE), or other suitable deposition techniques. The preferable techniques are generally considered to be the MO-CVD and MBE processes.

Since it is necessary to laterally modify the doping, mobility, band gap and refractive index of the epitaxially grown compound semiconductor layers (such as doping or compositional superlattices) for monolithic integration of all relevant optical components, there has arisen the need to perform selective intermixing of different semiconductor layers, typically of thickness ranging from about 5 Å to about 5 microns, comprising device structures such as $GaAs/Al_xGa_{1-x}As$ superlattices and related heterostructures used for optoelectronics. Heretofore, in the prior art, such selective intermixing has been achieved by either localized diffusion or implantation of both donor or acceptor impurities.

In particular, there is disclosed in U.S. Pat. No. 4,378,255 a method by which a multilayer, III-V semiconductor structure can be disordered and shifted up in energy gap into single crystalline form by the expedient of a zinc diffusion. In particular, this U.S. Pat. No. 4,378,255 teaches that all or selected portions of a multilayer of either gallium arsenide/aluminum arsenide or gallium arsenide/aluminum gallium arsenide can be converted into a single crystal aluminum gallium arsenide having a higher energy gap than that of the original structure by the process of a zinc diffusion at low temperature. However, this prior art technique suffers from the disadvantage that substantial intermixing of the superlattice layers requires diffusion times on the order of hours. Furthermore, this prior art technique is unable to obtain such intermixing without the introduction of substantial impurity atom concentration into the superlattice materials.

Also recently reported in the literature is a related technique for the formation of $Al_xGa_{1-x}As$ alloy on a semi-insulating GaAs substrate by irradiating a two-layer structure of AlAs and GaAs with a high power continuous wave (cw) argon laser. This technique was reported by N.V. Joshi and J. Lehman in "Formation of $Al_xGa_{1-x}As$ Alloy on the Semi-insulating GaAs Substrate by Laser Beam Interaction", Materials Research Society Symposia Proceedings, Vol 51, p. 185-189 (1986). However, the reported quality of the alloyed material obtained by this method, based on a stationary or quasi-stationary cw beam, appears to be inferior and often leads to destruction of the material. No mention is made in this work of the use of pulsed or of rapidly scanned laser or electron beams with dwell times of a fraction of a second to grow alloys or to intermix relatively complex structures to obtain intermixed materials of high quality or final composite structures of high complexity.

It would therefore be desirable to provide an improved method for more rapid selective intermixing of multilayered materials which provides material of superior electronic and optical properties and which, in addition, avoids the necessity of introducing impurity atoms into the material as occurs in the method taught by U.S. Pat. No. 4,378,255. Moreover, in contrast to the work of Joshi and Lehman, it would be desirable to provide a new method that would be applicable to the intermixing of complex multilayered structures such as laser heterostructures and superlattices. It should be apparent that such an improvement would enhance the entire field of integrated optics/optical signal processing. Such improvements are achieved in the present invention by utilizing pulsed or rapidly scanned directed energy sources such as those derived from suitably chosen laser beams or electron beams for intermixing of multilayered structures.

SUMMARY OF THE INVENTION

Accordingly, it is a general object of the present invention to provide an improved method for selective intermixing of layered structures, such that the method is relatively simple and yet overcomes the disadvantages of the prior art.

It is an object of the present invention to provide a method for selective intermixing of layered structures by irradiating with a pulsed or rapidly scanned laser beam or electron beam.

It is another object of the present invention to provide a method for selective intermixing of multilayered semiconductor structures such as varied heterostructures and superlattices by irradiating with a single pulse from a suitable laser.

It is still another object of the present invention to provide a method for selective intermixing of multilayered semiconductor structures by irradiating with a series of pulses from a suitable laser in order to increase the degree of intermixing.

It is still another object of the present invention to provide a method for selective intermixing of GaAs-/$Al_xGa_{1-x}As$ multilayers by irradiating with either a single pulse or a series of pulses from a frequency-doubled Nd:YAG laser or excimer laser.

It is yet another object of the present invention to provide new integrated structures formed in part of layers of thin solid films which are selectively intermixed by irradiation with an energy source which contain laterally and/or vertically isolated regions exhibiting different physical properties than the unmixed regions.

BRIEF DESCRIPTION OF THE DRAWINGS

These and other objects and advantages of the present invention will become more fully apparent from the following detailed description, when read in conjunction with accompanying drawings with like reference numerals indicating corresponding parts throughout, wherein.

DESCRIPTION OF THE PREFERRED EMBODIMENT

Figure 1:
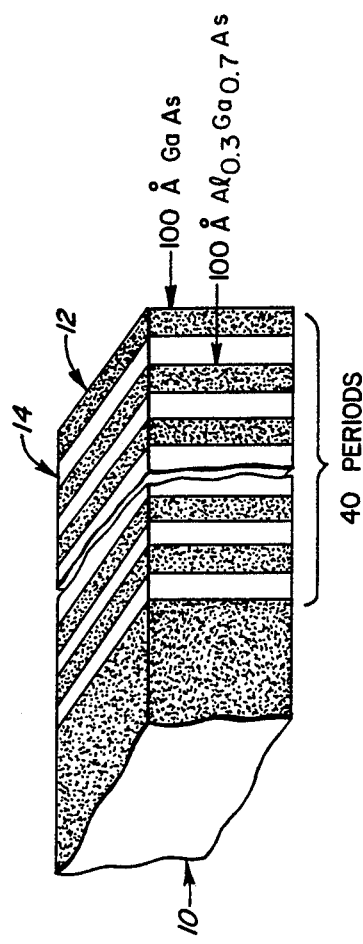
FIGS. 1(a) and 1(b) show enlarged, side elevational views of two superlattices samples for use in the present invention.

Referring now in detail to the drawings, there is shown in FIG. 1(a) a multilayer structure 10 composed of separate layers of thin solid films referred to as a superlattice comprised of 40 periods. Each period consists of a quantum-well layer 12 and a barrier layer 14. In the superlattice 10, each quantum-well layer 12 has a thickness of approximately 100 Ångstroms (Å) and each barrier layer 14 has a thickness of approximately 100 Å. The quantum-well layers 12 have a smaller band gap and may be formed of a semiconductor material such as gallium arsenide (GaAs). The barrier layers 14 have a larger band gap and may be formed of a semiconductor material such as aluminum gallium arsenide ($Al_xGa_{1-x}As$) with aluminum mole fraction x=0.3. The value of x=0.3 has been chosen as an illustrative example; other values can also be easily used. FIG. 1(b) shows another superlattice structure 10a having 40 periods, with each period consisting of a GaAs quantum-well layer 12a and a $Al_{0.3}Ga_{0.7}As$ barrier layer 14a. Each of the quantum-well layers 12a has a thickness of approximately 50 Å, and each of the barrier layers 14a has a thickness of approximately 100 Å.

It has been discovered that the above GaAs/$Al_{0.3}Ga_{0.7}As$ superlattice samples 10 and 10a can be selectively intermixed so as to change compositionally, such that the superlattice layers lose their individual identities, by irradiating with a pulsed laser. While superlattice intermixing has been achieved in prior art by localized diffusion or implantation of both donor or acceptor impurities, it is not known where else such superlattice intermixing has been accomplished by irradiating the superlattice with an energy source such as with the output of a pulsed laser.

Figure 2:
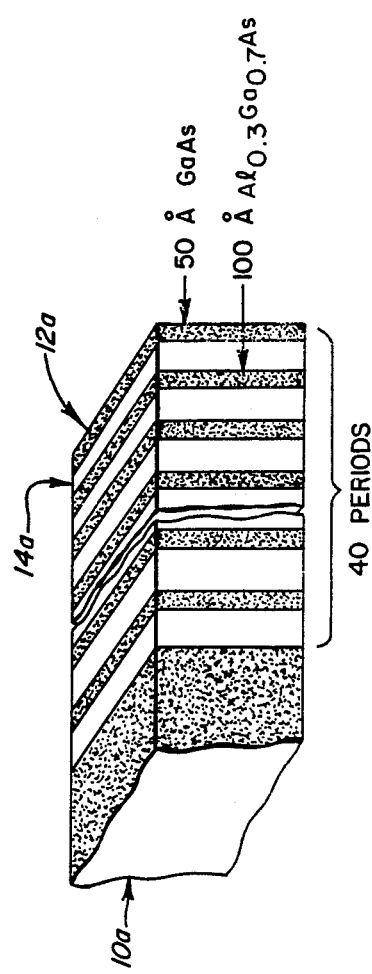
FIG. 2 is a block diagram of an apparatus for selective intermixing of a superlattice, constructed in accordance with the principles of the present invention, and utilizing an excimer laser as the energy source.
Figure 3:
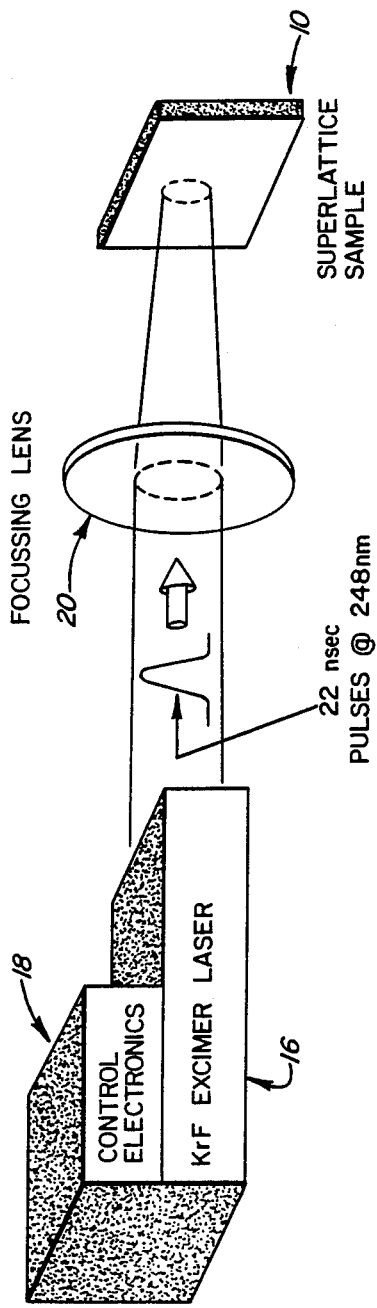
FIG. 3 is a block diagram of an apparatus for selective intermixing of a superlattice, constructed in accordance with the principles of the present invention, and utilizing a frequency-doubled Nd:YAG laser as the energy source.

In FIGS. 2 and 3, there are shown diagrams illustrating apparatuses utilized for selective intermixing of a superlattice in accordance with the principles of the present invention. Each apparatus includes an energy source or laser device 16 (FIG. 2) or 16a (FIG. 3) which generates a pulsed output with a varying amount of energy per pulse under the control of a power controller 18. The laser device 16 is a commercially available krypton fluoride (KrF) excimer laser operating at a wavelength of approximately 248 nanometers (nm) with a pulse duration of about 22 nsec. The excimer laser is provided with a single-shot or multiple-pulse firing capability. The laser 16a is a commercially available frequency-doubled Q-switched/Nd:YAG (an acronym for neodymium; yttrium, aluminum and garnet) laser having also a single-shot or multiple-pulse firing capability. The Nd:YAG laser operates at a wavelength of approximately 532 nanometers (nm) with a pulse duration of about 10 nsec. The output of the laser device 16 or 16a is directed onto the superlattice sample 10 or 10a via a focussing lens 20. The energy-density incident on the superlattice sample 10 or 10a is varied by adjusting the laser pulse energy or the focussed spot size at the sample surface.

It should be understood to those skilled in the art that the laser devices 16 and 16a operating at the chosen wavelengths and in a pulsed mode are not the only energy sources available for use. For example, a rapidly scanned continuous wave (CW) laser or a pulsed or rapidly scanned electron beam can be utilized in place of the laser devices 16 and 16a for intermixing similar of the multilayer structures. Other laser wavelengths may also be chosen. The laser wavelength and incident power are chosen with respect to the absorption length and thermal diffusion properties of the layered structure so that a sufficient power density is deposited in those regions of the sample which are to be intermixed. The pulse duration of the pulsed energy source or the local dwell time (scan rate) of the rapidly scanned CW energy source are chosen with respect to the thermal stability of the various elements or compounds in the layered structure so as to avoid chemical decomposition of, or mechanical damage to the structure during the intermixing process and are determined to be much less than a second for materials such as GaAs and $Al_xGa_{1-x}As$.

For instance, in the case of the GaAs/$Al_xGa_{1-x}As$ superlattice samples shown in FIGS. 1(a) and 1(b) an energy density of approximately 100–200 mJ/cm$^2$ at the sample surfaces in pulses of 10 to 25 nanosecond duration, generated by either the pulsed excimer or Q-switched Nd:YAG laser previously discussed above, is sufficient to achieve substantial intermixing of the superlattice layers following single-pulse irradiation. Since these two types of laser devices are both capable of generating output energies exceeding 1 Joule per pulse, they are more than adequate as energy sources for this particular intermixing application. Further, it was observed that when laser intermixing was performed on the sample 10a of FIG. 1(b) with a single Nd:YAG pulse of 10 nsec duration and an estimated energy density of 400 mJ/cm$^2$ incident on the sample surface, visible damage ("cratering") was induced. However, when an energy density of approximately 50 mJ/cm$^2$ was used there was no visible crystal damage due to the irradiation by a single pulse.

Figure 4:
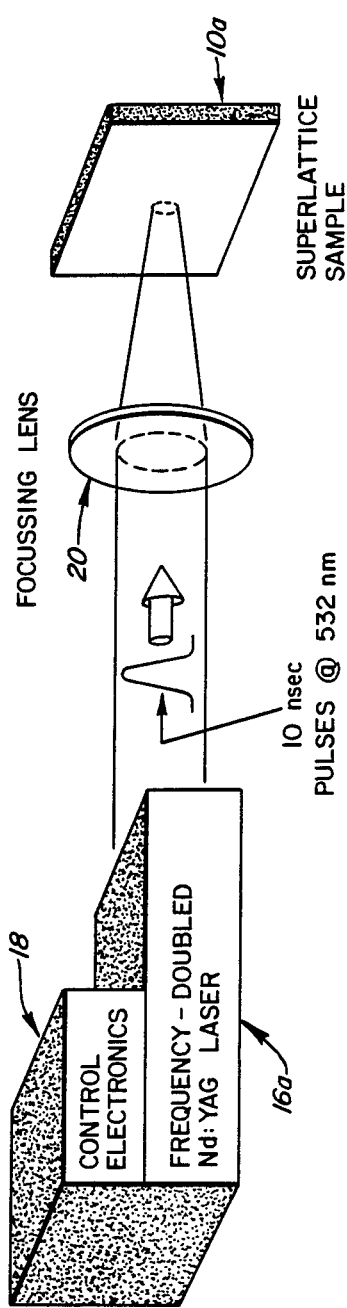
FIGS. 4(a) and 4(b) are, respectively, Raman scattering profiles of an as-grown region of the sample in FIG. 1(a) and a region of the sample which has been irradiated with a single pulse from a KrF excimer laser.

Raman scattering spectra were measured on as-grown and excimer laser-irradiated regions of the sample 10 of FIG. 1(a) for evaluation of the degree of intermixing produced by the present invention. FIG. 4(a) shows the Raman spectrum of an as-grown region of the sample. As can be seen, a longitudinal optical (LO) phonon peak appears at a frequency of 292 cm$^{-1}$ due to the pure GaAs layers and a GaAs-like LO phonon peak appears at a frequency of 281 cm$^{-1}$ due to the $Al_{0.3}Ga_{0.7}As$ layers. FIG. 4(b) presents the Raman spectrum from a region of the same sample which has been irradiated by a single excimer laser pulse at an energy density of approximately 200 mJ/cm$^2$. As seen, only a single GaAs-like phonon peak is observed, at a frequency of 286 cm$^{-1}$ corresponding to an intermixed $Al_xGa_{1-x}As$ alloy of the expected median composition $x=0.15$. The above data indicates that extensive intermixing of the original superlattice layers in the sample has occurred.

Figure 5:
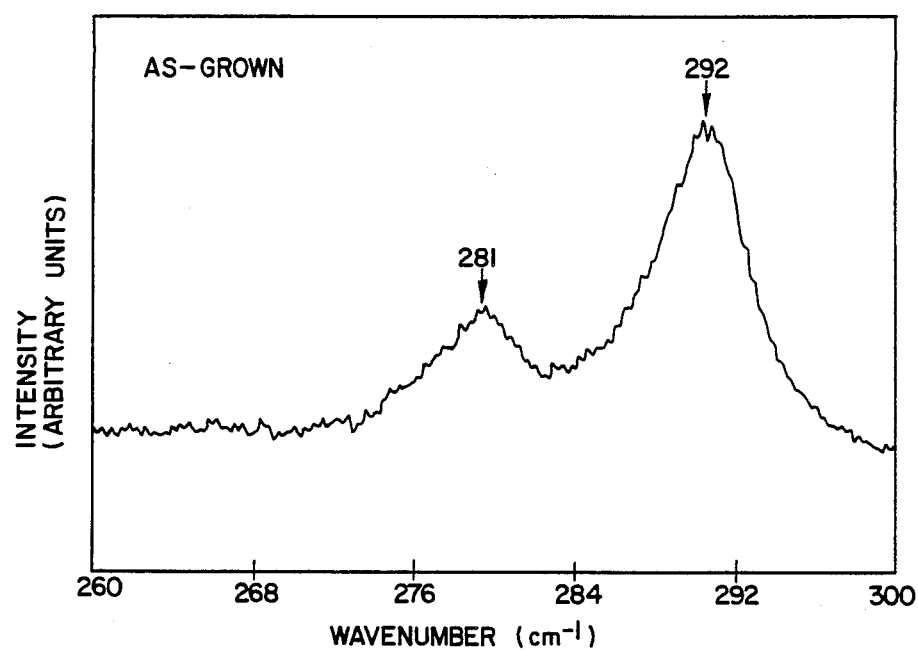
FIGS. 5(a) and 5(b) are, respectively, sputter-Auger composition-depth profiles of an as-grown region of the same in FIG. 1(a) and a region of the sample which has been irradiated with a single pulse from a KrF excimer laser.

Next, the extent of the interdiffusion of the GaAs layers and the $Al_{0.3}Ga_{0.7}As$ layers was determined by the technique of sputter-Auger profiling, which utilizes a combination of physical sputtering and Auger electron spectroscopy to generate a composition-depth profile of the layered structure. FIG. 5(a) shows both Ga and Al depth profiles through the first 21 periods (to a depth of about 4250 Å) of the as-grown region of the sample 10 in FIG. 1(a). The effect of laser irradiation is dramatic; as shown in FIG. 5(b), complete intermixing of the first 11 periods (about 2100 Å) has occurred. In addition, the transition from the intermixed phase to the unperturbed spuerlattice structure is observed to be very abrupt. The Al mole fraction of the intermixed alloy is very close to $x=0.15$, as expected. The above data indicates the excimer laser irradiation is capable of generating complete intermixing of GaAs/$Al_xGa_{1-x}As$ superlattice layers, with abrupt vertical transition between the intermixed and unmixed regions.

This selective intermixing by irradiation with an energy source of the separate layers of thin solid films, consisting of a plurality of quantum-well semiconductor layers interleaved with a plurality of barrier semiconductor layers defining the compositional superlattice, provides a new integrated structure. The integrated structure includes laterally and/or vertically isolated regions exhibiting optical and electronic properties different than those of the alloy generated by intermixing the quantum-well layers and the barrier layers. The boundary between the unmixed and the intermixed regions in the integrated structure of the present invention is very abrupt. This feature permits the fabrication of optical and/or electronic components which are more closely packed in two- or three-dimensional configurations. For such multi-dimensional device configurations, the present invention can be used advantageously due to the fact that the irradiation creates an abrupt transition in depth between the intermixed and unmixed regions.

Figure 6:
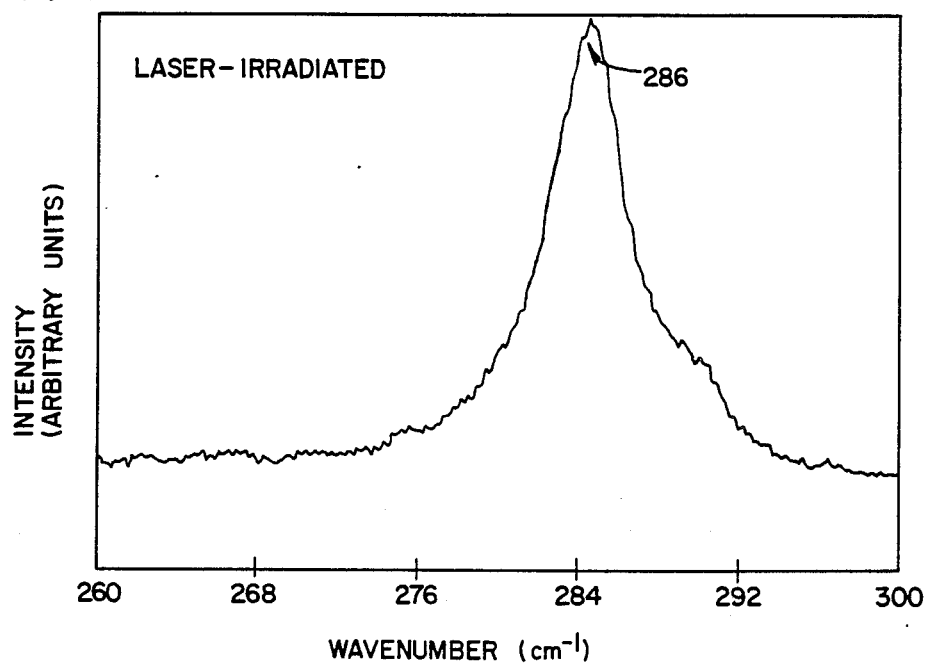
FIGS. 6(a) and 6(b) are Raman scattering profiles of an as-grown region of the sample in FIG. 1(b) and a region of the same sample which has been irradiated with five pulses from a frequency-doubled Nd:YAG laser.
Figure 7:
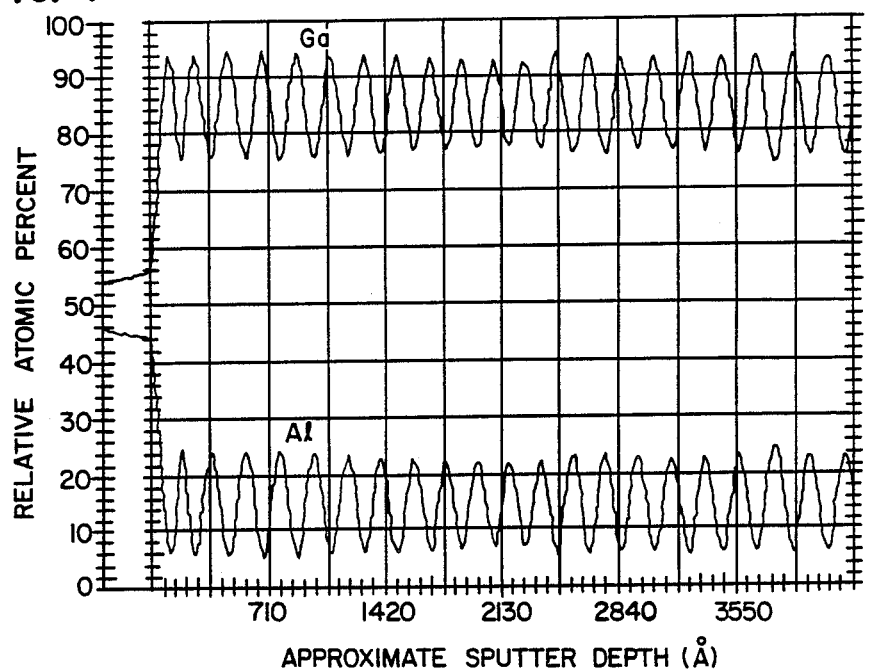
Figure 8:
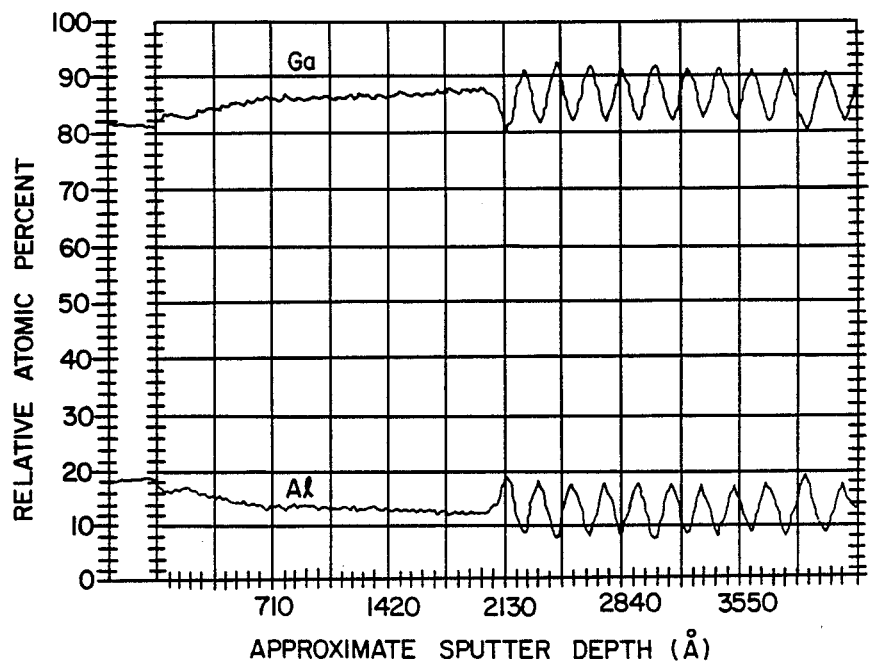
Figure 9:
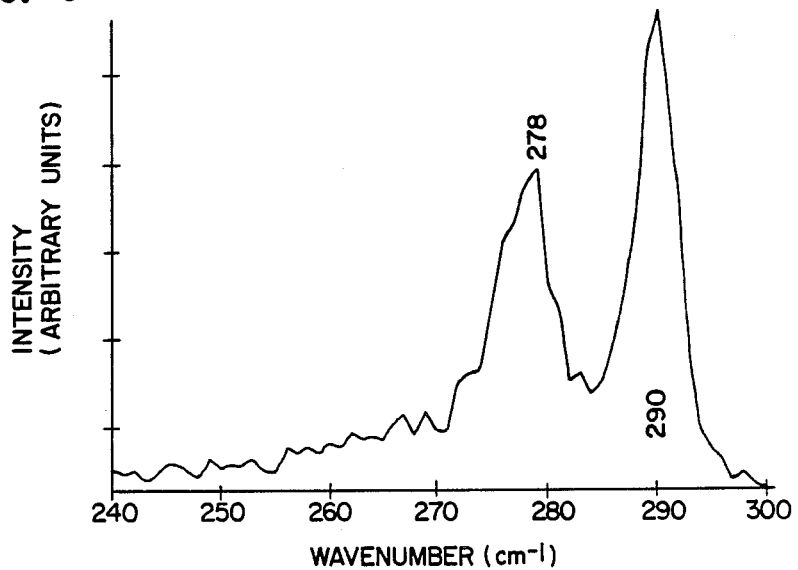
Figure 10:
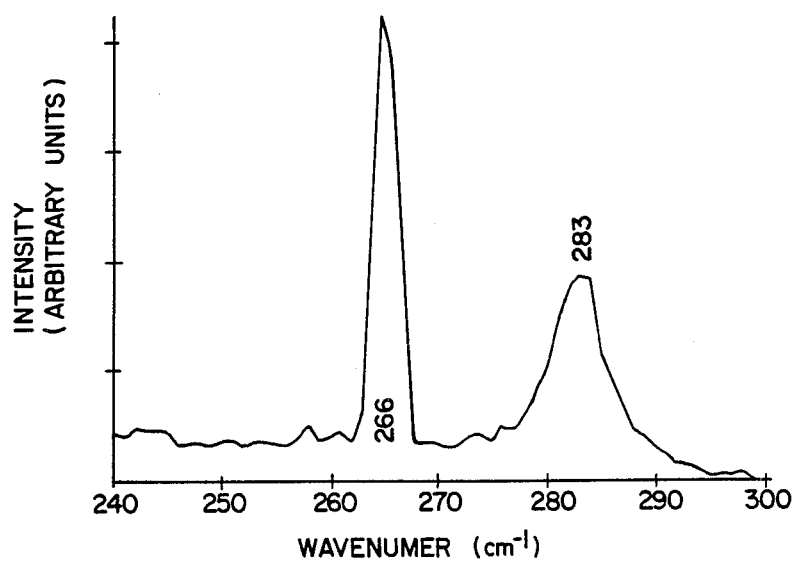

Raman scattering spectra were also measured on as-grown and Nd:YAG laser-irradiated regions of the superlattice sample 10a of FIG. 1(b). FIG. 6(a) shows the Raman spectrum of an as-grown region of the sample. Again, LO phonon peaks appear at frequencies of 278 cm$^{-1}$ and 290 cm$^{-1}$, corresponding to the $Al_{0.3}Ga_{0.7}As$ and GaAs layers respectively. FIG. 6(b) shows the Raman spectrum from a region of the same sample which has been irradiated with five pulses from the Nd:YAG laser 16a of FIG. 3 at an energy density of 120 mJ/cm$^2$ for each pulse. The single relatively narrow LO phonon peak at a frequency of 283 cm$^{-1}$ corresponds to a throughly intermixed $Al_xGa_{1-x}As$ alloy of median composition $x=0.2$, as expected from complete intermixing of the original layered structure. In addition, a prominent symmetry-forbidden transverse optical (TO) phonon peak is observed at a frequency of 266 cm$^{-1}$, indicative of microscopic lattice damage or strain. This feature has been attributed to the presence of large thermal gradients within the volume of the sample irradiated by the Nd:YAG laser, since the output beam from this device has been observed to provide a highly non-uniform intensity profile. It is believed that microscopic lattice damage and strain can be minimized by ensuring laser beam uniformity and, in addition, by using a heated sample mount to reduce thermal gradients in the sample during irradiation.

Although the present invention has a wide range of applications, it has specific and immediate interest to the fabrication of various active and passive optoelectronic devices and integrated structures. The optoelectronic devices can comprise active emitters, detectors, bistable switching elements, waveguide switches, and passive waveguides elements requiring both lateral and vertical variations in the refractive index of the host materials. Further, while the present embodiment was described in connection with the GaAs/Al$_x$Ga$_{1-x}$As crystal system, it should be also applicable to a wide range of other layered structures including, but not limited to, metallic superlattices and semiconductor superlattices in different crystal systems.

From the foregoing detailed description, it can thus be seen that the present invention provides an improved method for selective intermixing of superlattice layers by irradiating with a single pulse from a laser. Further, the irradiation can be with multiple pulses from one or both lasers, or other combination of lasers and electron beam sources, so as to increase the degree of intermixing.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method for selective intermixing of a multilayer structure, commonly known as a compositional superlattice, formed by a plurality of alternating layers of two different semiconducting materials, such that one set of layers, known as the quantum-well layers, is composed of a semiconductor material of smaller energy band gap, and the other set of layers, known as the barrier layers, is composed of a semiconductor material of larger band gap, to obtain laterally and/or vertically isolated regions, said regions exhibiting optical and electronic properties different than those of the alloy generated by intermixing said quantum-well layers and said barrier layers, said method comprising the steps of:
providing a compositional superlattice; and
irradiating said compositional superlattice with an energy source to selectively intermix the quantum-well layers and the barrier layers in said compositional superlattice.

2. A method for selective intermixing as claimed in claim 1, wherein the energy source comprises a pulsed or rapidly scanned laser beam or electron beam, or suitable combinations thereof.

3. A method for selective intermixing as claimed in claim 1, wherein said quantum-well layers are GaAs.

4. A method for selective intermixing claimed in claim 1, wherein said quantum-well layers are approximately 100 Å in thickness.

5. A method for selective intermixing as claimed in claim 2, wherein said laser or electron beam consists of a single pulse from a pulsed laser or electron beam.

6. A method for selective intermixing as claimed in claim 2, wherein said laser or electron beam consist of a rapidly scanned beam whose dwell times on each irradiated portion of the sample are much less than a second.

7. A method for selective intermixing as claimed in claim 3, wherein said barrier layers are Al$_{0.3}$Ga$_{0.7}$As.

8. A method for selective intermixing as claimed in claim 3, wherein said barrier layers are Al$_x$Ga$_{1-x}$As having a variable Al mole fraction x.

9. A method for selective intermixing as claimed in claim 4, wherein said barrier layers are approximately 100 Å in thickness.

10. A method for selective intermixing as claimed in claim 5, further comprising the step of irradiating said superlattice with multiple pulses from one or more lasers and electron beams, and combinations thereof, to increase the degree of intermixing.

11. A method for selective intermixing of a multilayer structure originally consisting of two or more thin separate layers of at least two distinct materials to obtain laterally and/or vertically isolated regions exhibiting physical properties different than said multilayer structure, said method comprising the steps of:
providing a multilayer structure; and
irradiating said multilayer structure with a transient or pulsed energy source so as to selectively intermix the separate layers within said multilayer structure.

12. A method for selective intermixing as claimed in claim 11, wherein the energy source comprises a laser or electron beam;

13. A method for selective intermixing as claimed in claim 12, wherein said laser or electron beam consist of a single pulse from a pulsed laser or electron beam.

14. A method of selective intermixing as claimed in claim 12, wherein said laser or electron beam consists of a rapidly scanned beam whose dwell times on each irradiated portion of the multilayer structure are less than a second.

15. A method for selective intermixing as claimed in claim 13, further comprising the step of irradiating said multilayer structure with multiple pulses from various lasers or electron beams, or combinations thereof, to increase the degree of intermixing.

16. A method for selective intermixing of a two layer structure, commonly known as a single heterostructure, in which the first thin layer is composed of one semiconductor material, and the second thin layer is deposited over said first layer and is composed of another semiconductor material of different band gap than said first layer, to obtain laterally and/or vertically isolated regions, said regions exhibiting optical and electronic properties different than those of the alloy generated by intermixing said two semiconductor layers, said method comprising the steps of:
providing a single heterostructure; and
irradiating said single heterostructure with a pulsed or rapidly scanned laser beam or electron beam, or suitable combinations thereof to selectively intermix the two semiconductor layers in said single heterostructure.

17. A method for selective intermixing of a three layer semiconductor structure, commonly known as a double heterostructure, in which the middle layer is composed of a semiconductor material of energy band gap different than that of the two surrounding semiconductor layers, to obtain laterally and/or vertically isolated regions, said regions exhibiting optical and electronic properties different than those of the alloy generated by intermixing said three semiconductor layers, said method comprising the steps of:
  providing a double heterostructure; and
  irradiating said double heterostructure with an energy source to selectively intermix the three semiconductor layers in said double heterostructure.

18. A method for selective intermixing of a multilayer structure, commonly known as a doping superlattice, formed by the introduction of different impurity atoms into alternating layers of one semiconducting material, to obtain laterally and/or vertically integrated regions, said regions exhibiting optical and electronic properties different than those of the alloy generated by intermixing said layers, said method comprising the steps of:
  providing a doping superlattice; and
  irradiating said doping superlattice with an energy source to selectively intermix the layers in said doping superlattice.

* * * * *